(12) United States Patent
Dubey et al.

(10) Patent No.: US 9,508,660 B2
(45) Date of Patent: Nov. 29, 2016

(54) MICROELECTRONIC DIE HAVING CHAMFERED CORNERS

(71) Applicant: Intel Corporation, Santa Clara, CA (US)

(72) Inventors: Manish Dubey, Chandler, AZ (US);
Emre Armagan, Chandler, AZ (US);
Rajendra C. Dias, Phoenix, AZ (US);
Lars D. Skoglund, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/618,647

(22) Filed: Feb. 10, 2015

(65) Prior Publication Data

US 2016/0233175 A1    Aug. 11, 2016

(51) Int. Cl.
| | |
|---|---|
| *H01L 29/06* | (2006.01) |
| *H01L 23/00* | (2006.01) |
| *H01L 23/31* | (2006.01) |
| *H01L 23/12* | (2006.01) |
| *H01L 21/304* | (2006.01) |
| *H01L 21/56* | (2006.01) |

(52) U.S. Cl.
CPC ............ *H01L 23/562* (2013.01); *H01L 21/304* (2013.01); *H01L 21/563* (2013.01); *H01L 23/12* (2013.01); *H01L 23/3157* (2013.01); *H01L 29/06* (2013.01)

(58) Field of Classification Search
CPC ............................... H01L 33/48; H01L 24/01
See application file for complete search history.

(56) References Cited

U.S. PATENT DOCUMENTS

2010/0078769 A1*  4/2010  West ..................... H01L 23/562
                                                                257/620

* cited by examiner

*Primary Examiner* — Elias M Ullah
(74) *Attorney, Agent, or Firm* — Winkle, PLLC (57) ABSTRACT

A microelectronic die may be formed with chamfer corners for reducing stresses which can lead to delamination and/or cracking failures when such a microelectronic die is incorporated into a microelectronic package. In one embodiment, a microelectronic die may include at least one substantially planar chamfering side extending between at least two adjacent sides of a microelectronic die. In another embodiment, a microelectronic die may include at least one substantially curved or arcuate chamfering side extending between at least two adjacent sides of a microelectronic die.

24 Claims, 11 Drawing Sheets

MICROELECTRONIC DIE HAVING CHAMFERED CORNERS

TECHNICAL FIELD

Embodiments of the present description generally relate to the field of microelectronic device fabrication, and, more particularly, to using microelectronic dice having at least one chamfered corner to reduce delamination failures.

BACKGROUND

The microelectronic industry is continually striving to produce ever faster and smaller microelectronic packages for use in various electronic products, including, but not limited to portable products, such as portable computers, digital cameras, electronic tablets, cellular phones, and the like. Some of these electronic products, such as electronic tablets and cellular phones, have a relatively short life expectancy, i.e. about three years, and, thus, the reliability requirements for the microelectronic packages used in these electronic products has reduced. However, electronic products using high performance microelectronic packages with an estimated end life of about 5-7 years still require good reliability performance.

Reliability related failures within these high performance microelectronic packages are primarily due to interlayer dielectric delamination and fillet cracks. Such failures have been exacerbated by the use of low-k and ultra low-k interlayer dielectric materials in the fabrication of these microelectronic packages to reduce their size. Therefore, there is a need to develop package designs which reduce such reliability failures.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Embodiments of the present description include a microelectronic die with chamfer corners for reducing stresses which can lead to delamination and/or cracking failures, and microelectronic packages formed with such microelectronic dice. In one embodiment, a microelectronic die may include at least one planar chamfer extending between at least two adjacent sides of a microelectronic die. In another embodiment, a microelectronic die may include at least one curved chamfer extending between at least two adjacent sides of a microelectronic die.

Figure 1:
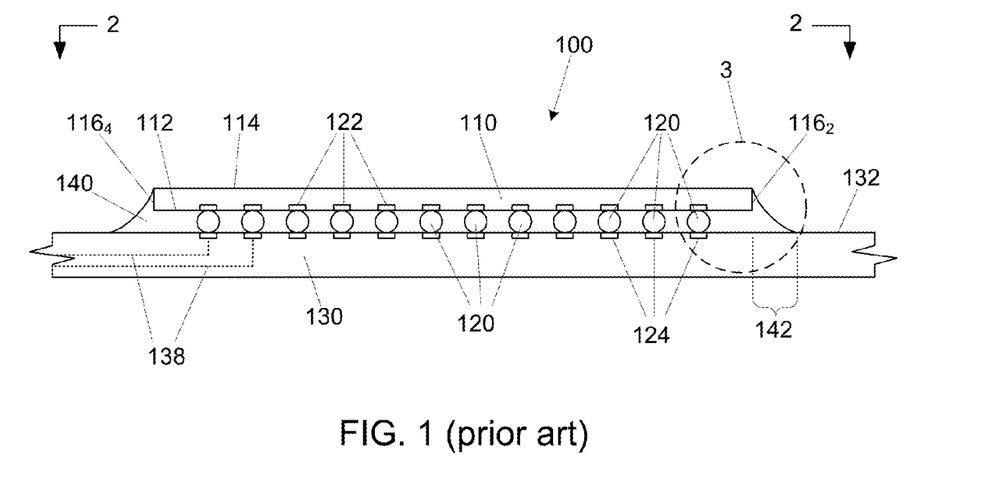
FIG. 1 is a side cross sectional view of a microelectronic die attached to a microelectronic substrate, as known in the art.

In the production of microelectronic devices, microelectronic dice are generally mounted on substrates, which provide electrical communication routes between the microelectronic die and external components. As shown in FIG. 1, a microelectronic package 100 may be formed by attaching at least one microelectronic die 110, such as a microprocessor, a chipset, a graphics device, a wireless device, a memory device, an application specific integrated circuit, or the like, to a microelectronic substrate 130, such as an interposer, a motherboard, or the like, through a plurality of interconnects 120. The interconnects 120 may extend between bond pads 122 on an active surface 112 of the microelectronic die 110 and mirror-image bond pads 124 on a first surface 132 of the microelectronic substrate 130, in a configuration generally known as a flip-chip or controlled collapse chip connection ("C4") configuration. The microelectronic die bond pads 122 may be in electrical communication with integrated circuitry (not shown) within the microelectronic die 110. The microelectronic substrate bond pads 124 may be in electrical communication with conductive routes 138 (illustrated by dashed lines) within the microelectronic substrate 130. The conductive routes 138 may provide electrical communication routes between the microelectronic die 110 on the microelectronic substrate 130 and/or with additional external components (not shown).

An electrically-insulating flowable material, such as an underfill material 140, may be disposed between the microelectronic die 110 and the microelectronic substrate 130, which substantially encapsulate the interconnects 120. The underfill material 140 may be used to reduce mechanical stress issues that can arise from thermal expansion mismatch between the microelectronic die 110 and the microelectronic substrate 130. The underfill material 140 may be an epoxy material, including, but not limited to epoxy, cyanoester, silicone, siloxane and phenolic based resins, that has sufficiently low viscosity to be wicked between the microelectronic die 110 and the microelectronic substrate 130 by capillary action when introduced by an underfill material dispenser (not shown) along at least one side of the microelectronic die 110, such as illustrated sides $116_2$ and $116_4$, which extend between the microelectronic die active surface 112 and an opposing back surface 114 of the microelectronic die 110. The portion of the underfill material 140 extending past the microelectronic die sides $116_1$, $116_2$, $116_3$, and $116_4$ (see FIG. 4) is referred to as an underfill material fillet 142. The underfill material 140 should not be of such a low viscosity that the underfill material fillet 142 extends too far from the microelectronic die sides $116_1$, $116_2$, $116_3$, and $116_4$, as it may extend to a "keep-out-zone" (not shown) where the presence of the underfill material 140 would be detrimental. The underfill material 140 may be subsequently cured (hardened).

The microelectronic substrate 130 may comprise any appropriate dielectric material, including, by not limited to, liquid crystal polymer, epoxy resin, bismaleimide triazine resin, FR4, polyimide materials, and the like. The conductive routes 138 may be formed of any appropriate conductive material, including, but not limited to, copper, silver, gold, nickel, and alloys thereof. It is understood that the microelectronic substrate 130 may be formed from any number of dielectric layers, may contain a rigid core (not shown), and may contain active and/or passive microelectronic devices (not shown) formed therein. It is also understood that solder resist layers (not shown) could be utilized on the microelectronic substrate first surface 132, as will be understood to those skilled in the art. The processes used for forming the microelectronic substrate 130 are well known to those skilled in the art, and for the sake of brevity and conciseness will not be described or illustrated herein.

The interconnects 120 can be made any appropriate material, including, but not limited to, solders and conductive filled epoxies. Solder materials may include may be any appropriate material, including but not limited to, lead/tin alloys, such as 63% tin/37% lead solder, or lead-free solders, such a pure tin or high tin content alloys (e.g. 90% or more tin), such as tin/bismuth, eutectic tin/silver, ternary tin/silver/copper, eutectic tin/copper, and similar alloys. When the microelectronic die 110 is attached to the microelectronic substrate 130 with interconnects 120 made of solder, the solder is reflowed, either by heat, pressure, and/or sonic energy to secure the solder between the microelectronic die bond pads 122 and the microelectronic substrate bond pads 124. Additionally, the microelectronic die 110 may be a copper pillar based flip chip component which is attached to the microelectronic substrate 130, as will be understood to those skilled in the art.

Figure 2:
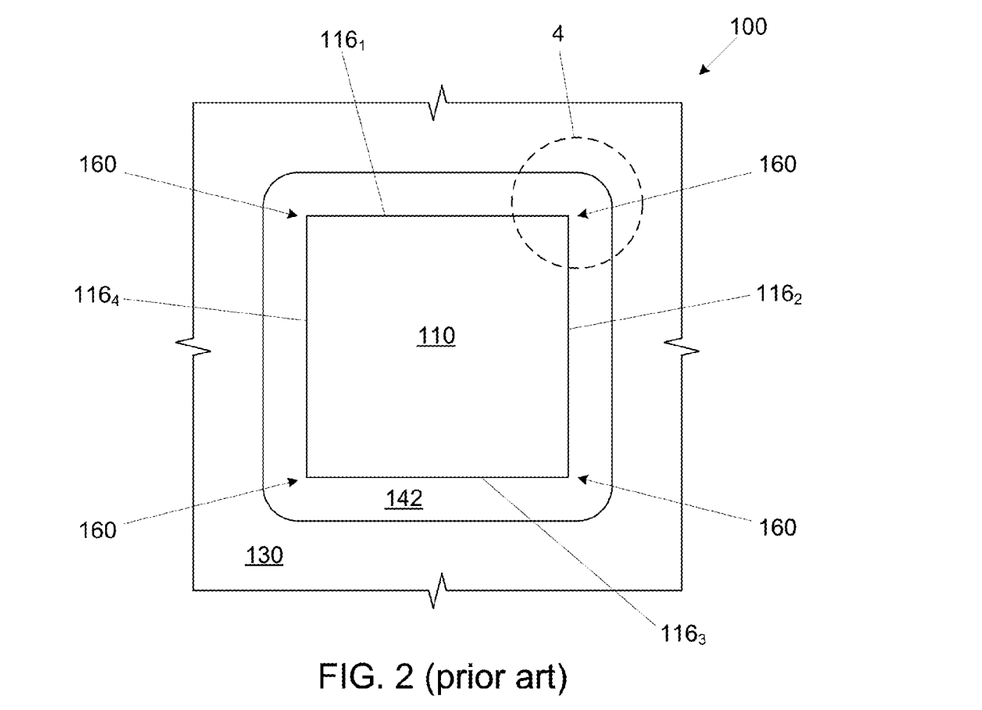
FIG. 2 is a top plan view along line 2-2 of FIG. 1, as known in the art.

FIG. 2 illustrates a top plan view along line 2-2 of FIG. 1. As shown, the microelectronic die 110 may have four sides, illustrated as elements $116_1$, $116_2$, $116_3$, and $116_4$, wherein the each side may intersect with adjacent sides at approximate right angles to form corners 160. The term "adjacent sides" is defined to mean two microelectronic die sides which are at substantially 90 degrees (right angle) to one another.

Figure 3:
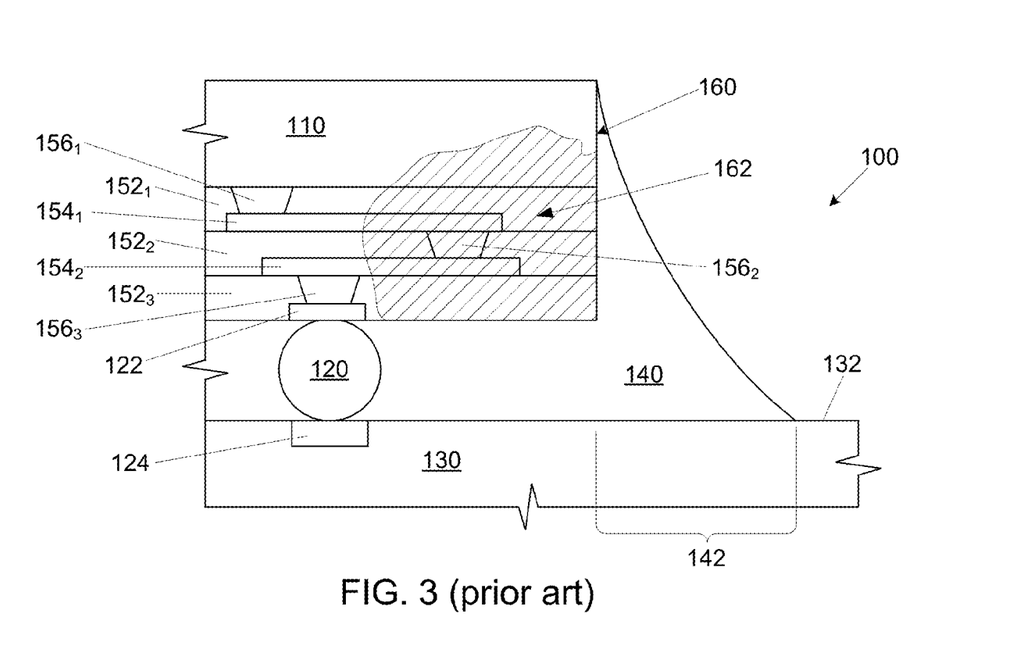
FIG. 3 is a side cross sectional view of inset 3 of FIG. 1, as known in the art.

As shown in FIG. 3 (a close-up of area 3 of FIG. 1), the microelectronic die 110 may include a build-up layer 150 comprising a plurality of dielectric layers (illustrated as elements $152_1$, $152_2$, and $152_3$) with a plurality of conductive traces (illustrated as elements $154_1$ and $154_2$) and conductive vias (illustrated as elements $156_1$, $156_2$, and $156_3$) for electrically connecting the microelectronic die bond pads 122 with integrated circuitry (not shown) within the microelectronic die 110. The conductive traces $154_1$ and $154_2$ and conductive vias $156_1$, $156_2$, and $156_3$ may be made of any appropriate conductive material, including, but not limited to, copper, aluminum, silver, gold, and the like, as well as alloys thereof. The dielectric layers $152_1$, $152_2$, and $152_3$ may be any appropriate dielectric material, including, but not limited to, interlayer dielectrics such as silicon dioxide and silicon nitride, as well as low-k and ultra low-k dielectrics (dielectric constants less than about 3.6), including but not limited to carbon doped dielectrics, fluorine doped dielectrics, porous dielectrics, organic polymeric dielectrics, silicon based polymeric dielectrics, and the like.

Figure 4:
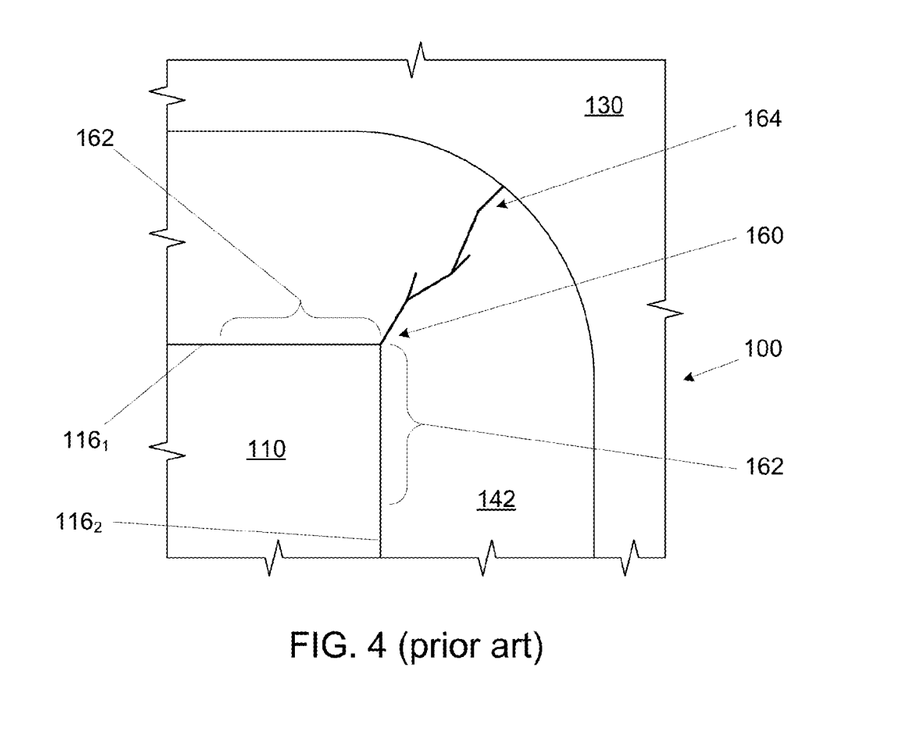
FIG. 4 is a top plan view of inset 4 of FIG. 2, as known in the art.

It is understood to those skilled in the art that most stresses in a microelectronic package 100 occur at the relatively sharp angle at the corners 160 of the microelectronic die 110. These stresses at the corners 160 (also referred to as "concentration points") may result in the microelectronic die sides 116$_1$, 116$_2$, 116$_3$, and 116$_4$ separating or delaminating from the underfill material fillet 142 proximate the microelectronic die corners 160. This delamination is shown generically as a shaded area in FIG. 3 and at a relative position in FIG. 4, both of which are labeled as element 162. Furthermore, the stresses may also cause cracks 164 to develop in the underfill material fillet 142, as shown in FIG. 4. It is understood that the delamination 162 and/or cracks 164 may lead to the failure of the microelectronic package 100.

Figure 5:
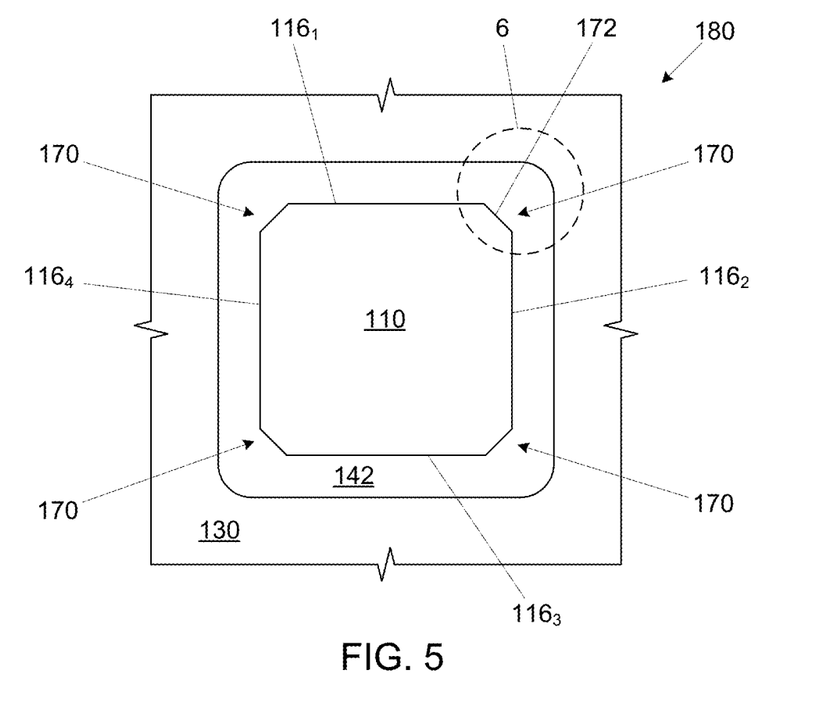
FIG. 5 is a top plan view of a microelectronic package comprising a microelectronic die having chamfer corners attached to a microelectronic substrate, according to an embodiment of the present description.
Figure 6:
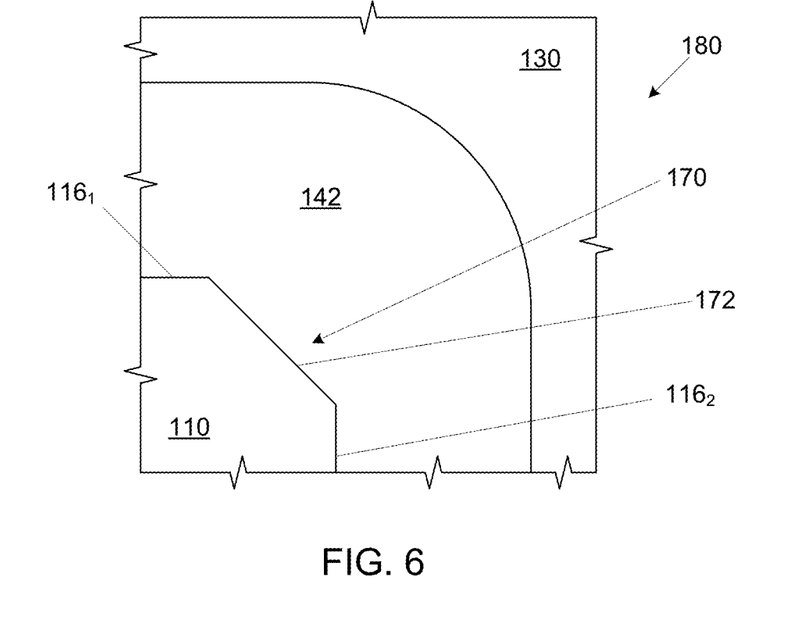
FIG. 6 is a top plan view of inset 6 of FIG. 5, according to an embodiment of the present description.
Figure 7:
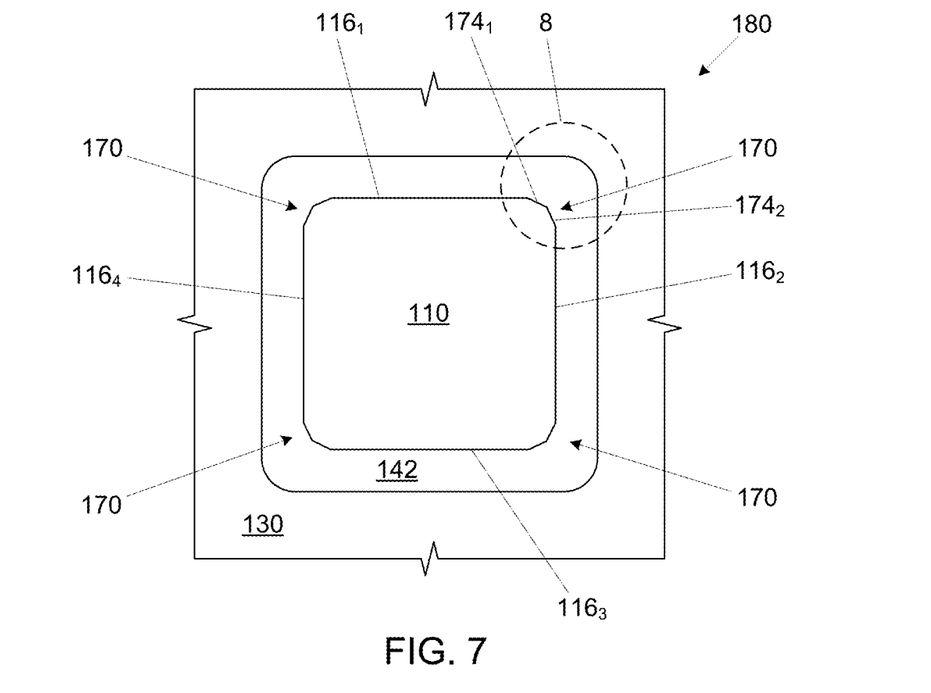
FIG. 7 is a top plan view of a microelectronic package comprising a microelectronic die having chamfer corners attached to a microelectronic substrate, according to another embodiment of the present description.
Figure 8:
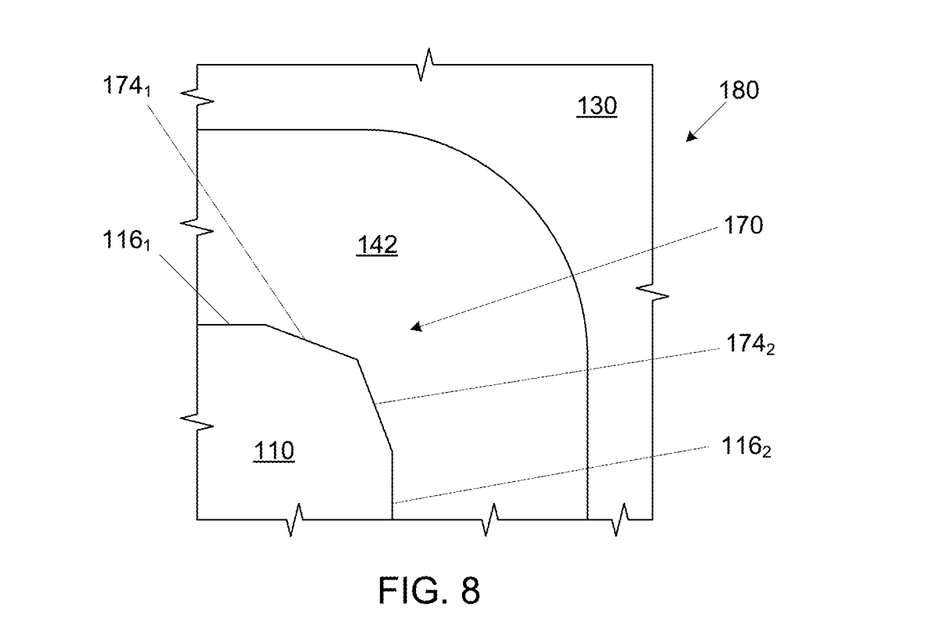
FIG. 8 is a top plan view of inset 8 of FIG. 7, according to another embodiment of the present description.

In embodiments of the present description, stresses may be reduced by forming a chamfered corner between adjacent sides of a microelectronic die. As shown in FIGS. 5-10, a chamfered corner 170 may be formed by removing a portion of the microelectronic die 110 between adjacent microelectronic die sides 116$_1$/116$_2$, 116$_2$/116$_3$, 116$_3$/116$_4$, and 116$_4$/116$_1$, and the microelectronic die 110 may be attached to the microelectronic substrate 130, as previously discussed, to form a microelectronic package 180. As shown in FIGS. 5 and 6, the chamfered corner 170 may be formed as a substantially planar chamfering side 172 between each of the adjacent microelectronic die sides 116$_1$/116$_2$, 116$_2$/116$_3$, 116$_3$/116$_4$, and 116$_4$/116$_1$. This results in eight corners, rather than four corners 160 of the microelectronic die 110 shown in FIGS. 1-4, which distributes the stresses to additional concentration points, thereby reducing the potential of delamination and cracking. Of course, the chamfered corner 170 is not limited to a single chamfering side between each of the adjacent microelectronic die sides 116$_1$/116$_2$, 116$_2$/116$_3$, 116$_3$/116$_4$, and 116$_4$/116$_1$, but may also include multiple, substantially planar chamfering sides, illustrated as chamfering sides 174$_1$ and 174$_2$, as shown in FIGS. 7 and 8, which distributes the stresses to an even higher number of concentration points.

Figure 9:
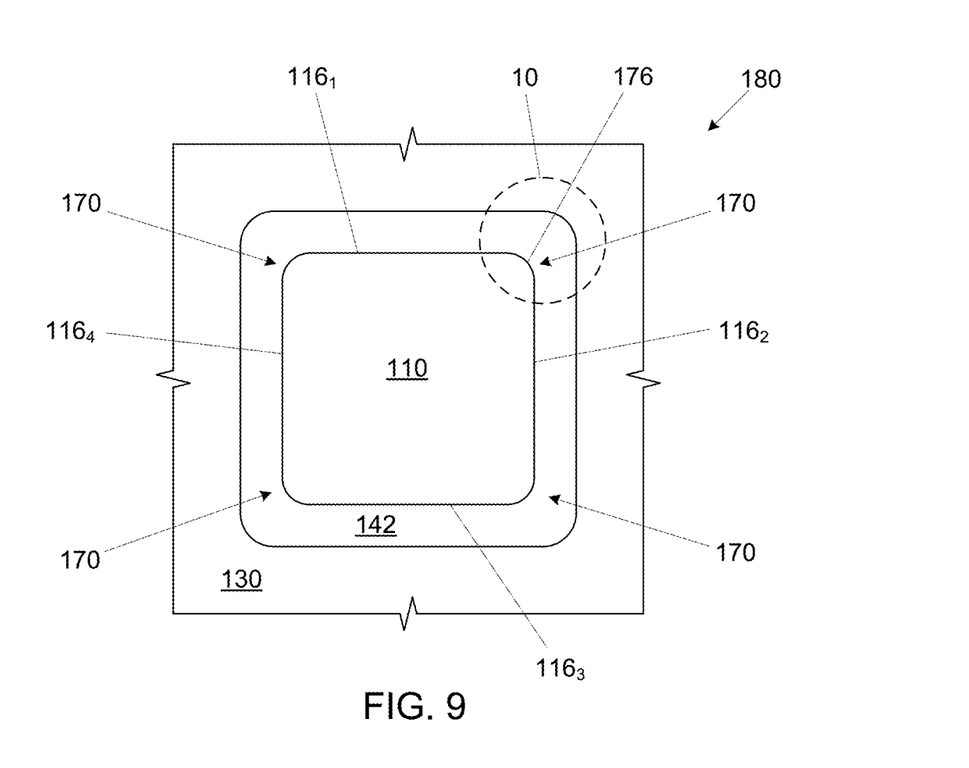
FIG. 9 is a top plan view of a microelectronic package comprising a microelectronic die having chamfer corners attached to a microelectronic substrate, according to still another embodiment of the present description.
Figure 10:
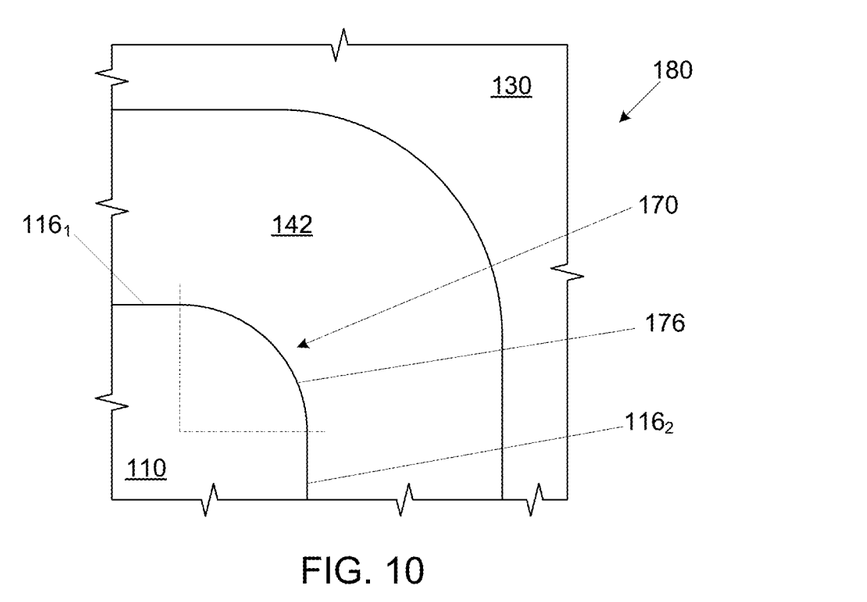
FIG. 10 is a top plan view of inset 10 of FIG. 9, according to still another embodiment of the present description.

In a further embodiment as shown in FIGS. 9 and 10, the chamfered corner 170 may be formed as a substantially curved or arcuate chamfering side 176 between each of the adjacent microelectronic die sides 116$_1$/116$_2$, 116$_2$/116$_3$, 116$_3$/116$_4$, and 116$_4$/116$_1$. Such arcuate chamfering sides 176 may eliminate specific high concentration points. It is noted that the dashed lines in FIG. 10 delineate between the first microelectronic die side 116$_1$, the arcuate chamfering side 176, and the second microelectronic die side 116$_2$.

Figure 11:
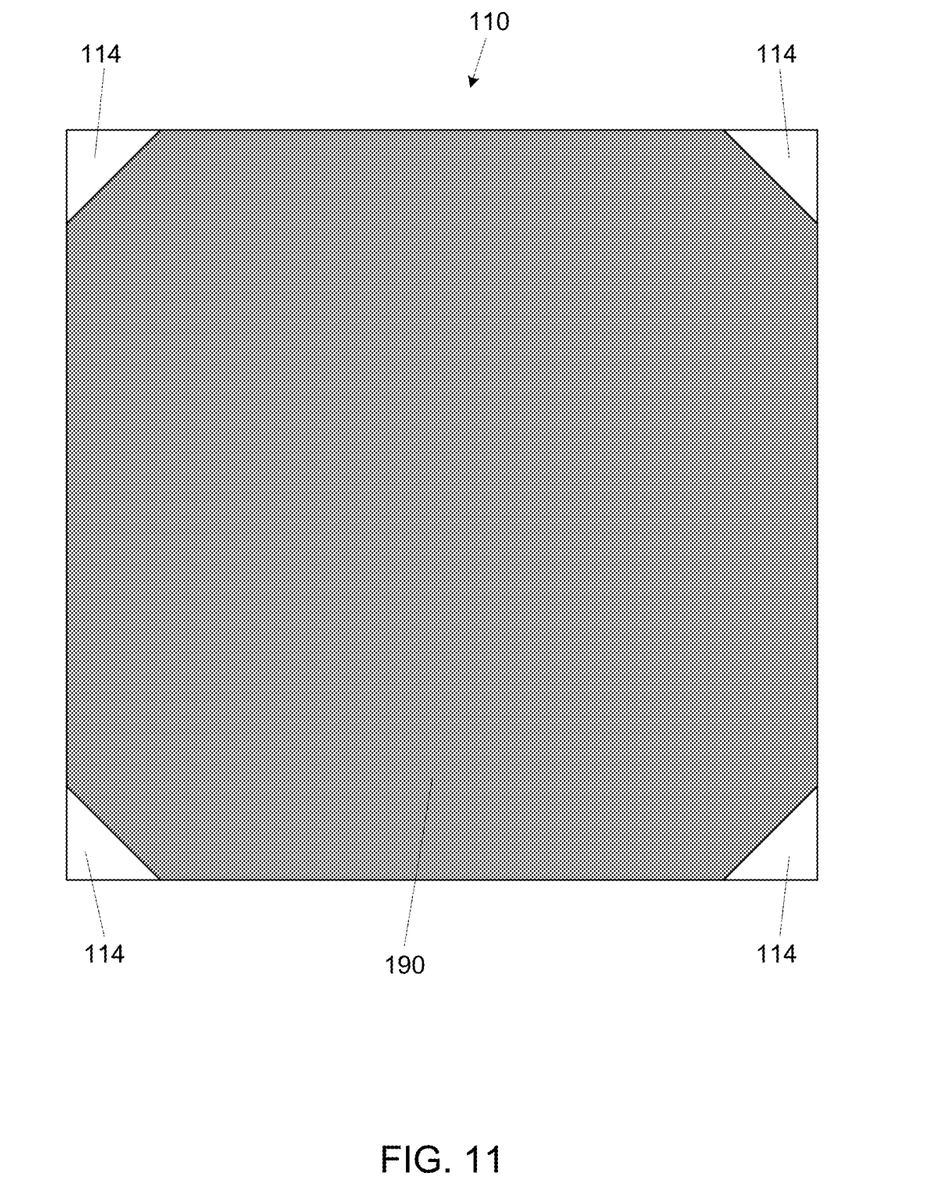
FIG. 11 is a top plan view of an microelectronic die having a mask patterning on a back surface thereof, according to yet still another embodiment of the present description.

In an embodiment of the present description, the chamfered corner 170, such as illustrate in FIGS. 5-10 may be formed during a singulation process, wherein a plurality of individual microelectronic dice 110 are cut from a microelectronic wafer (not shown), as will be understood to those skilled in the art. In one embodiment, a laser, such as an ultra-violet laser, an Ultra-fast last, and the like, may be used to singulate and form the chamfered corners 170 on each of the microelectronic dice 110. In another embodiment, the chamfered corner 170 may be formed after a singulation process, such as by mechanical milling, or by masked processes, including plasma etching or an excimer laser process, wherein a mask 190 (shaded area) may be formed in an appropriate pattern on the microelectronic die back surface 114, as shown in FIG. 11, prior to the formation of the chamfered corner 170 (see FIGS. 5-10). It is noted that the mask 190 illustrated in FIG. 11 will result in the chamfered corner 170 shape shown in FIGS. 5 and 6.

Figure 12:
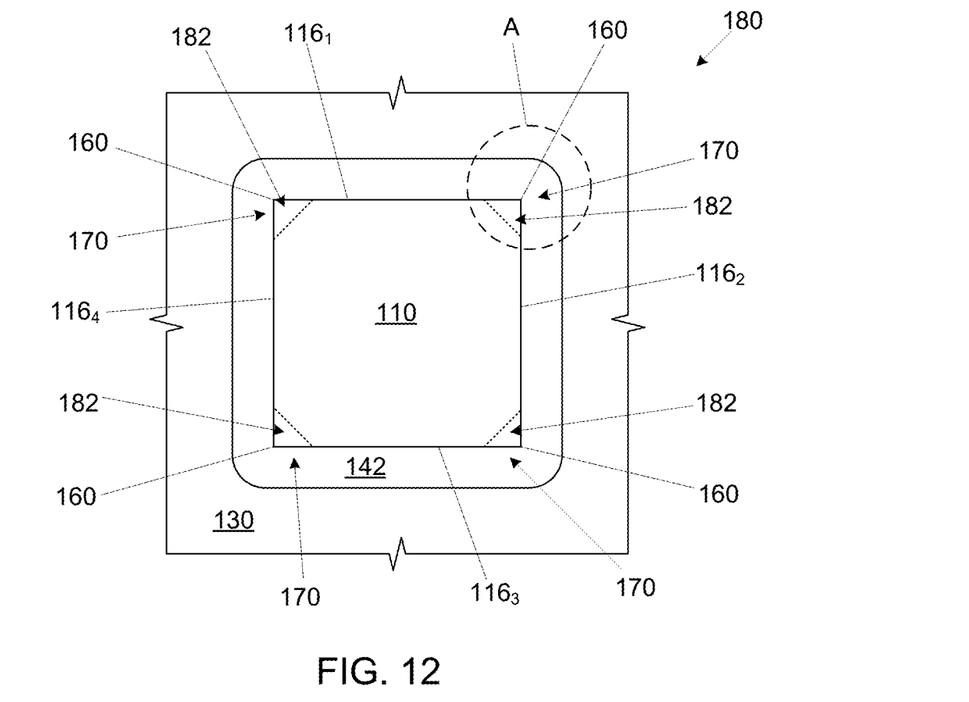
FIGS. 12-14 are top, cross-sectional, and oblique views, respectively, of a microelectronic die having chamfer corners which extend from an active surface of the microelectronic die without entirely removing the microelectronic die corner, according to one embodiment of the present description.
Figure 13:
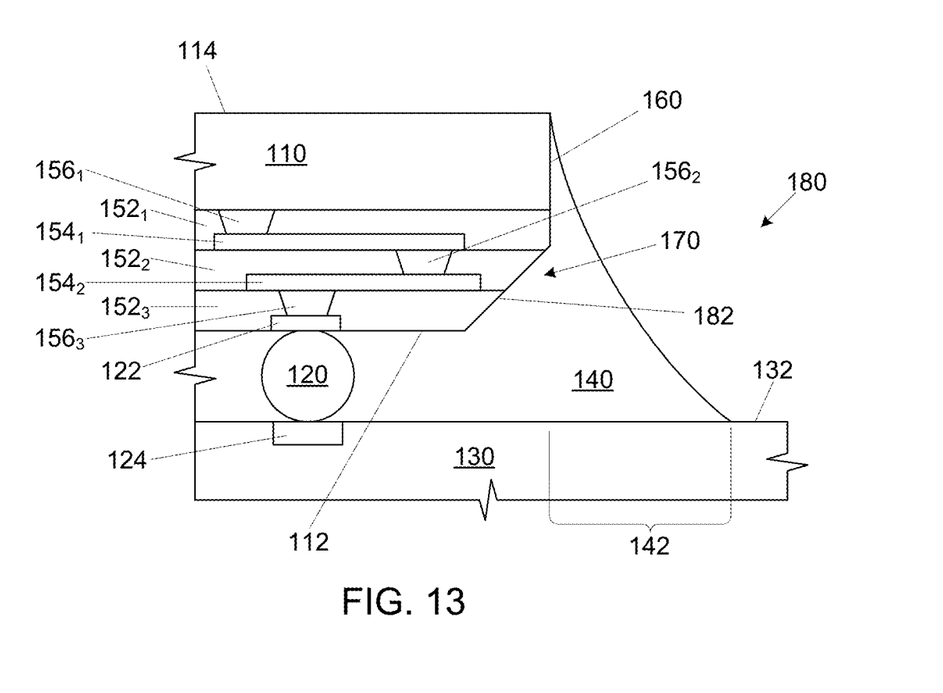
Figure 14:
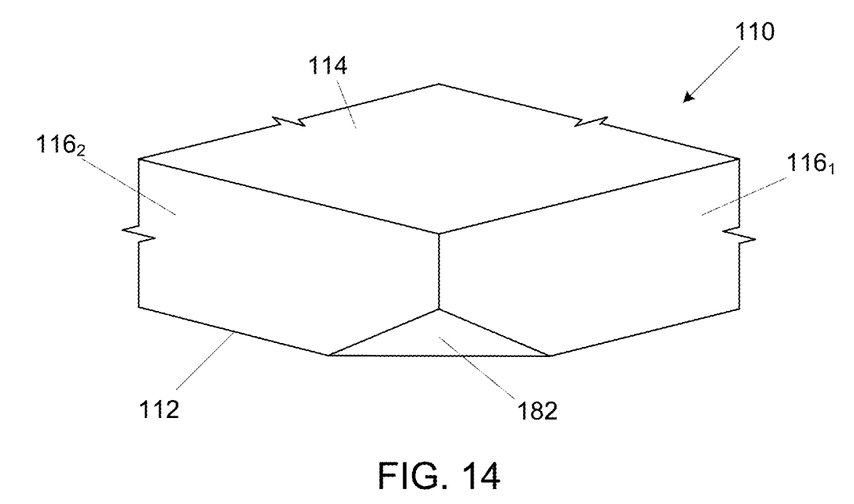
Figure 15:
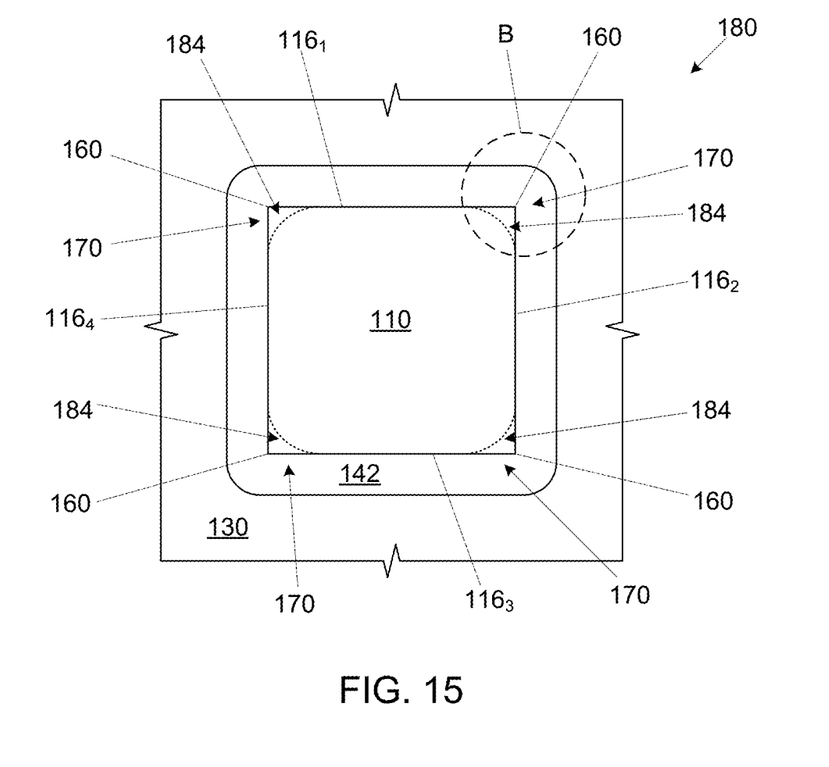
FIGS. 15-17 are top, cross-sectional, and oblique views, respectively, of a microelectronic die having chamfer corners which extend from an active surface of the microelectronic die without entirely removing the microelectronic die corner, according to another embodiment of the present description.
Figure 16:
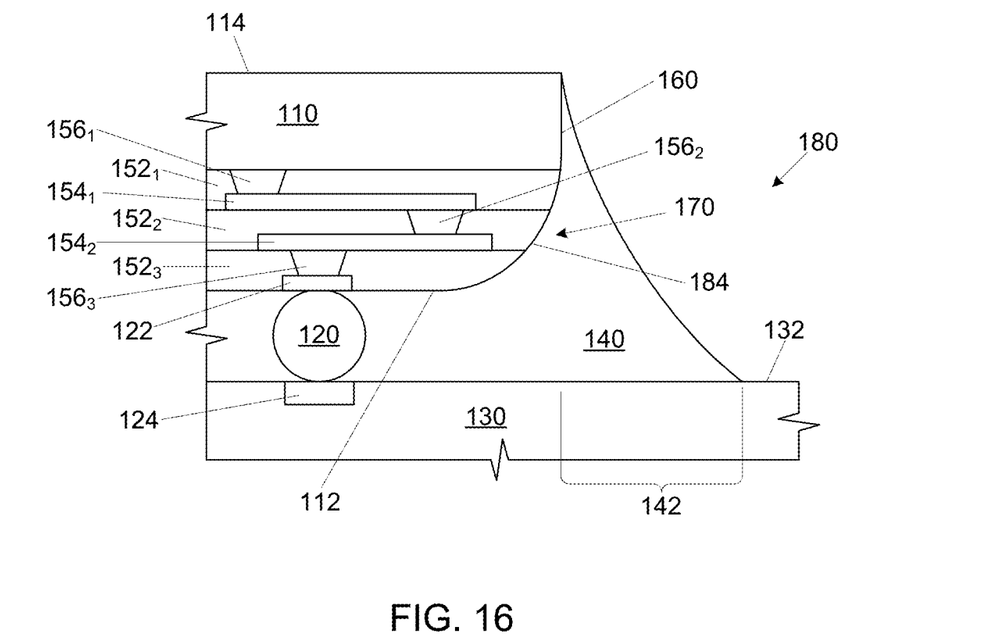
Figure 17:
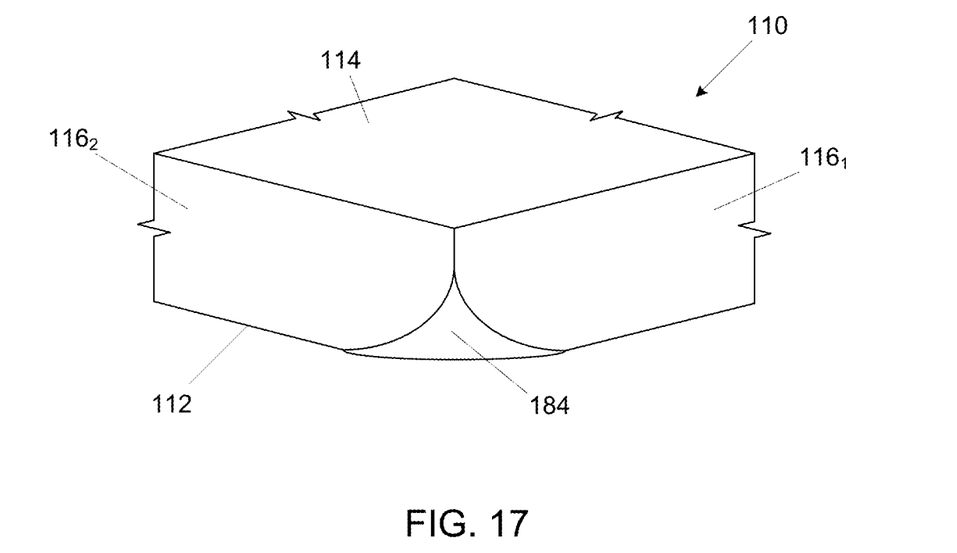

It is understood that the chamfered corners need not completely removed the corners. As shown in FIGS. 12-17, only a portion of the microelectronic die 110 may be removed at microelectronic die active surface (e.g. area of highest stress) such that the chamfered corners 170 may comprise a chamfering side (element 182 of FIGS. 12-14 and element 184 of FIGS. 15-17) extend from the microelectronic die active surface 112, between two adjacent microelectronic die sides (illustrated as microelectronic die sides 116$_1$ and 116$_2$), and to the microelectronic die corner 160. As shown in FIGS. 12 (a top view), 13 (a cross-sectional view in area A of FIGS. 12), and 14 (an oblique view in area A of FIG. 12), the chamfered corners 182 may be substantially planar. As shown in FIGS. 15 (a top view), 16 (a cross-sectional view in area B of FIGS. 15), and 17 (an oblique view in area B of FIG. 15), the chamfered corners 184 may be substantially arcuate.

Although FIGS. 1-17 illustrate a single microelectronic die 110, it is understood that a plurality of microelectronic dice may be attached to the microelectronic substrate 130.

Figure 18:
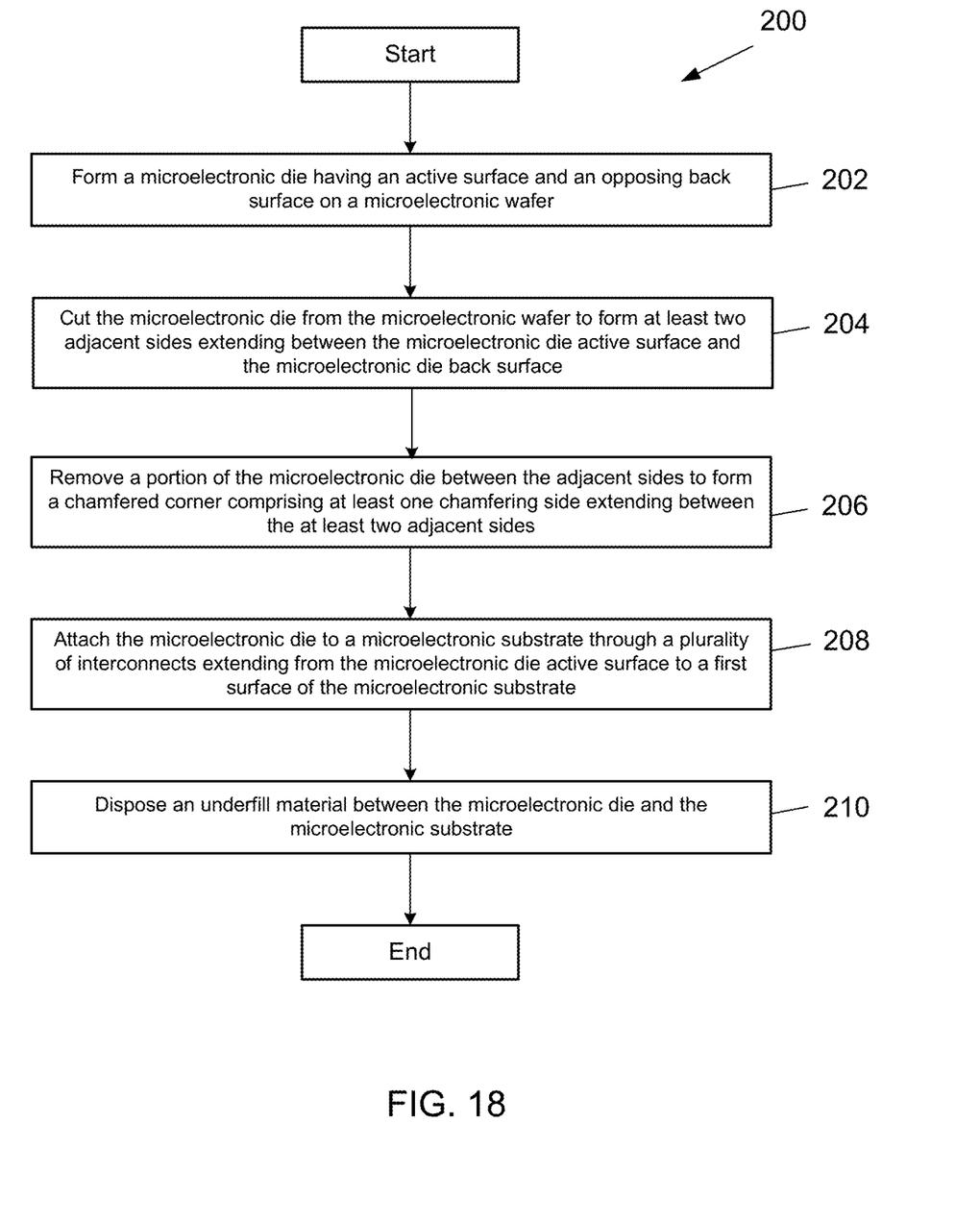
FIG. 18 is a flow chart of a process of fabricating a microelectronic package, according to an embodiment of the present description.

FIG. 18 is a flow chart of a process 200 of fabricating a microelectronic package according to an embodiment of the present description. As set forth in block 202, a microelectronic die may be formed having an active surface and an opposing back surface on a microelectronic wafer. The microelectronic die may be cut from the microelectronic wafer to form at least two adjacent sides extending between the microelectronic die active surface and the microelectronic die back surface, as set forth in block 204. As set forth in block 206, a portion of the microelectronic die between the at least two adjacent sides may be removed to form a chamfered corner comprising at least one chamfering side. The microelectronic die may be attached to a microelectronic substrate through a plurality of interconnects extending from the microelectronic die active surface to a first surface of the microelectronic substrate, as set in block 208. As set forth in block 210, an underfill material may be disposed between the microelectronic die and the microelectronic substrate.

Figure 19:
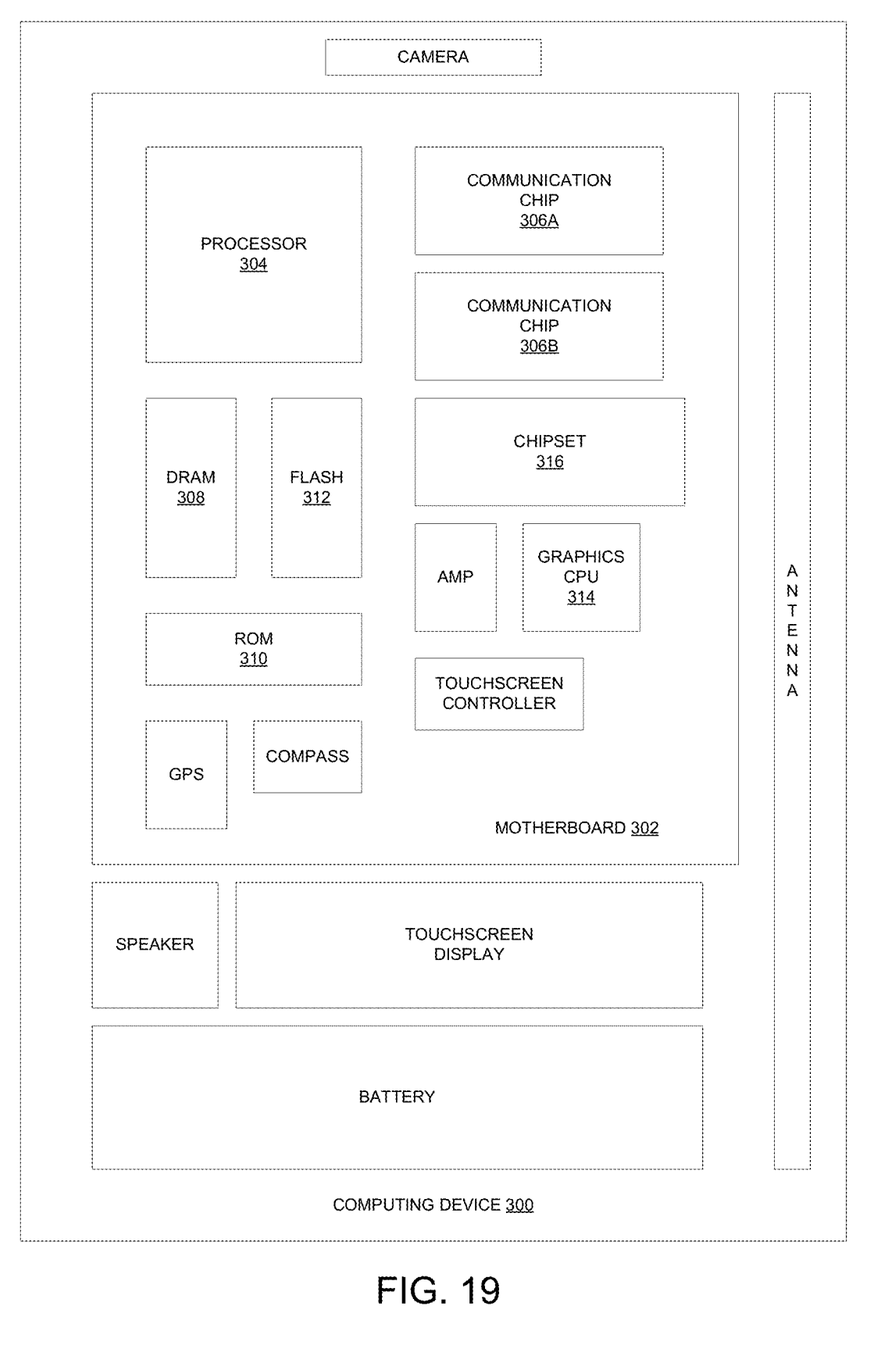
FIG. 19 illustrates a computing device in accordance with one implementation of the present description.

FIG. 19 illustrates a computing device 300 in accordance with one implementation of the present description. The computing device 300 houses a board 302. The board may include a number of microelectronic components, including but not limited to a processor 304, at least one communication chip 306A, 306B, volatile memory 308, (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker (not shown), a camera, and a mass storage device (not shown) (such as hard disk drive, compact disk (CD), digital versatile disk (DVD), and so forth). Any of the microelectronic components may be physically and electrically coupled to the board 302. In some implementations, at least one of the microelectronic components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

Any of the microelectronic components within the computing device 300 may include a microelectronic die having chamfered corners as described above.

In various implementations, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-19. The subject matter may be applied to other microelectronic device and assembly applications, as will be understood to those skilled in the art.

The following examples pertain to further embodiments, wherein Example 1 is a microelectronic device comprising a microelectronic die having an active surface, an opposing back surface, and at least two adjacent sides, wherein each of the adjacent sides extend between the microelectronic die active surface and the microelectronic die back surface; wherein the microelectronic die includes a chamfered corner comprising at least one chamfering side extending between the at least two adjacent sides.

In Example 2, the subject matter of Example 1 can optionally include the at least one chamfering side extending between the microelectronic die active surface and the microelectronic die back surface.

In Example 3, the subject matter of Example 1 can optionally include the at least one chamfering side extending between the microelectronic die active surface and a corner of the microelectronic die.

In Example 4, the subject matter of any of Examples 1 to 3 can optionally include the at least one chamfering side comprising a substantially planar side extending between the at least two adjacent sides.

In Example 5, the subject matter of any of Examples 1 to 3 can optionally include the at least one chamfering side comprising a plurality of substantially planar sides extending between the at least two adjacent sides.

In Example 6, the subject matter of any of Examples 1 to 3 can optionally include the at least one chamfering side comprising an arcuate side extending between the at least two adjacent sides.

In Example 7, the subject matter of any of Examples 1 to 3 can optionally include a microelectronic substrate, wherein the microelectronic die is electrically attached to the microelectronic substrate.

In Example 8, the subject matter of Example 7 can optionally include the microelectronic die being electrically attached to the microelectronic substrate through a plurality of interconnect extending between the microelectronic die active surface and a first surface of the microelectronic substrate.

In Example 9, the subject matter of Example 7 can optionally include an underfill material disposed between the microelectronic die and the microelectronic substrate.

The following examples pertain to further embodiments, wherein Example 10 is a method of fabricating a microelectronic device, comprising forming a microelectronic die having an active surface, an opposing back surface, and at least two adjacent sides, wherein each of the adjacent sides extend between the microelectronic die active surface and the microelectronic die back surface; and removing a portion of the microelectronic die between the at least two adjacent sides to form a chamfered cornered comprising at least one chamfering side extending between the at least two adjacent sides.

In Example 11, the subject matter of Example 10 can optionally include the at least one chamfering side extending between the microelectronic die active surface and the microelectronic die back surface.

In Example 12, the subject matter of Example 10 can optionally include the at least one chamfering side extending between the microelectronic die active surface and a corner of the microelectronic die.

In Example 13, the subject matter of any of Examples 10 to 12 can optionally include removing the portion of the microelectronic die between the at least two adjacent sides to form the chamfered corner comprises removing the portion of the microelectronic die between the at least two adjacent sides to form a substantially planar chamfering side extending between the at least two adjacent sides.

In Example 14, the subject matter of any of Examples 10 to 12 can optionally include removing the portion of the microelectronic die between the at least two adjacent sides to form the chamfered corner comprises removing the portion of the microelectronic die between the at least two adjacent sides to form a plurality of substantially planar chamfering sides extending between the at least two adjacent sides.

In Example 15, the subject matter of any of Examples 10 to 12 can optionally include removing the portion of the microelectronic die between the at least two adjacent sides to form the chamfered corner comprises removing the portion of the microelectronic die between the at least two adjacent sides to form an arcuate side extending between the at least two adjacent sides.

In Example 16, the subject matter of any of Examples 10 to 12 can optionally include forming a microelectronic substrate and electrically attaching the microelectronic die to the microelectronic substrate.

In Example 17, the subject matter of Example 16 can optionally include electrically attaching the microelectronic die to the microelectronic substrate comprising electrically attaching the microelectronic die to the microelectronic substrate through a plurality of interconnect extending between the microelectronic die active surface and a first surface of the microelectronic substrate.

In Example 18, the subject matter of Example 16 can optionally include disposing an underfill material between the microelectronic die and the microelectronic substrate.

In Example 19, the subject matter of Example 10 can optionally include forming the microelectronic die comprising forming the microelectronic die on a microelectronic wafer, and cutting the microelectronic die from the microelectronic wafer to form the at least two adjacent sides; and wherein removing the portion of the microelectronic die between the at least two adjacent sides to form the chamfered corner occurs during cutting the microelectronic die from the microelectronic wafer.

In Example 20, the subject matter of Example 10 can optionally include forming the microelectronic die comprising forming the microelectronic die on a microelectronic wafer, and cutting the microelectronic die from the microelectronic wafer to form the at least two adjacent sides; and wherein removing the portion of the microelectronic die between the at least two adjacent sides to form the chamfered corner occurs after cutting the microelectronic die from the microelectronic wafer.

The following examples pertain to further embodiments, wherein Example 21 is a electronic system, comprising a board; and a microelectronic package attached to the board, wherein the microelectronic package includes: a microelectronic die having an active surface, an opposing back surface, and at least two adjacent sides, wherein each of the adjacent sides extend between the microelectronic die active surface and the microelectronic die back surface; wherein the microelectronic die includes a chamfered corner comprising at least one chamfering side extending between the at least two adjacent sides.

In Example 22, the subject matter of Example 21 can optionally include the at least one chamfering side extending between the microelectronic die active surface and the microelectronic die back surface.

In Example 23, the subject matter of Example 21 can optionally include the at least one chamfering side extending between the microelectronic die active surface and a corner of the microelectronic die.

In Example 24, the subject matter of any of Examples 21 to 23 can optionally include the at least one chamfering side comprising a substantially planar side extending between the at least two adjacent sides.

In Example 25, the subject matter of any of Examples 21 to 23 can optionally include the at least one chamfering side comprising a plurality of substantially planar sides extending between the at least two adjacent sides.

In Example 26, the subject matter of any of Examples 21 to 23 can optionally include the at least one chamfering side comprising an arcuate side extending between the at least two adjacent sides.

In Example 27, the subject matter of any of Examples 21 to 23 can optionally include a microelectronic substrate, wherein the microelectronic die is electrically attached to the microelectronic substrate.

In Example 28, the subject matter of Example 27 can optionally include the microelectronic die being electrically attached to the microelectronic substrate through a plurality of interconnect extending between the microelectronic die active surface and a first surface of the microelectronic substrate.

In Example 29, the subject matter of Example 27 can optionally include an underfill material disposed between the microelectronic die and the microelectronic substrate.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A microelectronic device, comprising:
    a microelectronic die having an active surface, an opposing back surface, and at least two adjacent sides, wherein each of the adjacent sides extend between the microelectronic die active surface and the microelectronic die back surface;
    wherein the microelectronic die includes a chamfered corner comprising at least one chamfering side extending between the at least two adjacent sides; and
    wherein the microelectronic die includes a build-up layer comprising a plurality of dielectric layers with a plurality of conductive traces between the plurality of dielectric layer and a plurality of conductive vias extending between the plurality of conductive traces through the plurality of dielectric layers and wherein the at least one chamfering side extends between the microelectronic die active surface and the microelectronic die back surface including extending through the build-up layer.

2. The microelectronic device of claim 1, wherein the at least one chamfering side comprises a substantially planar side extending between the at least two adjacent sides.

3. The microelectronic device of claim 1, wherein the at least one chamfering side comprises a plurality of substantially planar sides extending between the at least two adjacent sides.

4. The microelectronic device of claim 1, wherein the at least one chamfering side comprises an arcuate side extending between the at least two adjacent sides.

5. The microelectronic device of claim 1, further including a microelectronic substrate, wherein the microelectronic die is electrically attached to the microelectronic substrate.

6. The microelectronic device of claim 5, wherein an underfill material is disposed between the microelectronic die and the microelectronic substrate.

7. An electronic system, comprising:
    a board; and
    a microelectronic package attached to the board, wherein the microelectronic package includes:
        a microelectronic die having an active surface, an opposing back surface, and at least two adjacent sides, wherein each of the adjacent sides extend between the microelectronic die active surface and the microelectronic die back surface;
        wherein the microelectronic die includes a chamfered corner comprising at least one chamfering side extending between the at least two adjacent sides; and
        wherein the microelectronic die includes a build-up layer comprising a plurality of dielectric layers with a plurality of conductive traces between the plurality of dielectric layers and a plurality of conductive vias extending between the plurality of conductive traces through the plurality of dielectric layers and wherein the at least one chamfering side extends between the microelectronic die active surface and the microelectronic die back surface including extending through the build-up layer.

8. The electronic system of claim 7, wherein the at least one chamfering side of the microelectronic die comprises a substantially planar side extending between the at least two adjacent sides.

9. The electronic system of claim 7, wherein the at least one chamfering side of the microelectronic die comprises a plurality of substantially planar sides extending between the at least two adjacent sides.

10. The electronic system of claim 7, wherein the at least one chamfereing side of the microelectronic die comprises an arcuate side extending between the at least two adjacent sides.

11. The electronic system of claim 7, wherein the microelectronic package further includes a microelectronic substrate, wherein the microelectronic die is electrically attached to the microelectronic substrate.

12. The electronic system of claim 11, wherein an underfill material is disposed between the microelectronic die and the microelectronic substrate.

13. A microelectronic device, comprising:
a microelectronic die having an active surface, an opposing back surface, and at least two adjacent sides, wherein each of the adjacent sides extend between the microelectronic die active surface and the microelectronic die back surface;
wherein the microelectronic die includes a chamfered corner comprising at least one chamfering side extending between the at least two adjacent sides; and
wherein the microelectronic die includes a build-up layer comprising a plurality of dielectric layers with a plurality of conductive traces between the plurality of dielectric layers and a plurality of conductive vias extending between the plurality of conductive traces through the plurality of dielectric layers and wherein the at least one chamfering side extends between the microelectronic die active surface and a corner of the microelectronic die through the build-up layer.

14. The microelectronic device of claim 13, wherein the at least one chamfering side comprises a substantially planar side extending between the at least two adjacent sides.

15. The microelectronic device of claim 13, wherein the at least one chamfering side comprises a plurality of substantially planar sides extending between the at least two adjacent sides.

16. The microelectronic device of claim 13, wherein the at least one chamfering side comprises an arcuate side extending between the at least two adjacent sides.

17. The microelectronic device of claim 13, further including a microelectronic substrate, wherein the microelectronic die is electrically attached to the microelectronic substrate.

18. The microelectronic device of claim 17, wherein an underfill material is disposed between the microelectronic die and the microelectronic substrate.

19. An electronic system, comprising:
a board; and
a microelectronic package attached to the board, wherein the microelectronic package includes:
a microelectronic die having an active surface, an opposing back surface, and at least two adjacent sides, wherein each of the adjacent sides extend between the microelectronic die active surface and the microelectronic die back surface;
wherein the microelectronic die includes a chamfered corner comprising at least one chamfering side extending between the at least two adjacent sides; and
wherein the microelectronic die includes a build-up layer comprising a plurality of dielectric layers with a plurality of conductive traces between the plurality of dielectric layers and a plurality of conductive vias extending between the plurality of conductive traces through the plurality of dielectric layers and wherein the at least one chamfering side extends between the microelectronic die active surface and a corner of the microelectronic die through the build-up layer.

20. The electronic system of claim 19, wherein the at least one chamfering side of the microelectronic die comprises a substantially planar side extending between the at least two adjacent sides.

21. The electronic system of claim 19, wherein the at least one chamfering side of the microelectronic die comprises a plurality of substantially planar sides extending between the at least two adjacent sides.

22. The electronic system of claim 19, wherein the at least one chamfereing side of the microelectronic die comprises an arcuate side extending between the at least two adjacent sides.

23. The electronic system of claim 19, wherein the microelectronic package further includes a microelectronic substrate, wherein the microelectronic die is electrically attached to the microelectronic substrate.

24. The electronic system of claim 23, wherein an underfill material is disposed between the microelectronic die and the microelectronic substrate.

* * * * *